(12) United States Patent
Dhalla et al.

(10) Patent No.: US 7,194,049 B2
(45) Date of Patent: Mar. 20, 2007

(54) DIGITAL AUTOMATIC LEVEL CONTROL SYSTEM

(75) Inventors: Cyrus A. Dhalla, Redondo Beach, CA (US); Michael S. Munoz, Redondo Beach, CA (US)

(73) Assignee: Northrop Grumman Corp., Los Angeles, CA (US)

( * ) Notice: Subject to any disclaimer, the term of this patent is extended or adjusted under 35 U.S.C. 154(b) by 918 days.

(21) Appl. No.: 10/271,100

(22) Filed: Oct. 15, 2002

(65) Prior Publication Data

US 2004/0071236 A1    Apr. 15, 2004

(51) Int. Cl.
    *H04L 27/08*    (2006.01)
(52) U.S. Cl. .................. 375/345; 375/316; 455/136; 455/138; 455/139.1; 455/240.1
(58) Field of Classification Search ............... 375/345, 375/316; 455/136, 138, 239.1, 240.1, 242.1, 455/245.1, 250.1
    See application file for complete search history.

(56) References Cited

U.S. PATENT DOCUMENTS

| | | | |
|---|---|---|---|
| 5,572,547 A | * | 11/1996 | Citta et al. .................. 375/232 |
| 5,644,601 A | * | 7/1997 | Kawaguchi .................. 375/295 |
| 6,510,188 B1 | * | 1/2003 | Isaksen et al. .............. 375/345 |
| 6,728,534 B1 | * | 4/2004 | Izumi et al. ............. 455/426.1 |
| 7,010,017 B2 | * | 3/2006 | Lin ............................ 375/147 |

* cited by examiner

*Primary Examiner*—Jay K. Patel
*Assistant Examiner*—Ted M. Wang
(74) *Attorney, Agent, or Firm*—Jones, Tullar & Cooper, P.C.

(57) ABSTRACT

A digital automatic level control system employs delay elements, which enable information about a signal parameter from the past, present and future to be processed to provide an optimal gain that can be used to level rapidly varying signals, such as bursty signals. As digital time samples of a signal are passed through first and second buffers, first and second accumulators maintain running sums that are related to the sum of the samples presently in the first and second buffers, respectively. The sums in the first and second accumulators represent information about the signal parameter for the future and the past, respectively. By choosing the maximum of these two values, the system can anticipate the beginning of a signal burst, and still have enough delay to compensate the end of a signal burst. In one embodiment of the invention, multiple channel signals can be leveled, either individually or in groups.

20 Claims, 3 Drawing Sheets

DIGITAL AUTOMATIC LEVEL CONTROL SYSTEM

BACKGROUND OF THE INVENTION

1. Field of the Invention

The present invention relates in general to a digital automatic level control system that employs digital elements for monitoring and controlling a signal parameter, such as power, voltage, etc. The system can control the levels or gains of multiple signals or channels either individually or in groups. Through use of information relating to the signal parameter's past, present and future levels, the system can respond accurately to quickly varying signals, such as bursty signals.

2. Description of the Background Art

There are numerous applications where power or other parameter levels of signals must be adjusted to facilitate processing. For example, in satellite communications systems, signals transmitted from sources in different areas of a satellite's uplink beam where atmospheric and antenna gain may vary, result in received power at the satellite that varies on a user-by-user basis. In addition, suboptimal tuning of each user's transmit antenna may increase the variation in received power at the satellite. Furthermore, users transmitting from discrete and disjoint beams produce received power at the satellite that varies through an even wider range of values.

One problem with receiving signals that vary in power over a wide range is that devices in the satellites often cannot work efficiently with such signals. For example, one known satellite communications system employs a digital transponder to combine, in the digital domain, user signals received from different uplink beams onto a single downlink beam, powered by a single TWTA, SSPA or other type of power amplifier (PA). All realizable amplifiers produce a nonlinear input power-to-output power response as input power and output power are increased. This nonlinearity produces an output signal that diverges from the input signal in a mean squared sense. To compensate for this undesirable effect, an engineering trade must be made, considering the maximum and minimum input powers, to set the gain of the PA in order that these nonlinearities are not produced, a process termed "backing off." If the input power to the PA varies by a great amount, the PA must be backed off by a large value, resulting in reduced PA efficiency. Thus, it is desirable to have an input signal to the PA that has as small a power variation as possible. In the context of the digital transponder, if received user signals from different uplink beams are combined to be transmitted on a single downlink beam with a single PA, and those user signals vary in power by a great amount, it is beneficial to the efficiency of the digital transponder to have a normalization scheme to level each user's received power in the digital transponder.

Current automatic level control (ALC) and automatic gain control (AGC) schemes perform power leveling using analog input/output signals. This is disadvantageous, because classical control theory must be employed, resulting in a delay in reaction time of the ALC, and/or sub-optimal leveling. As a result, such schemes do not work well with certain types of rapidly varying signals, such as are employed in burst communications schemes, for example. In addition, analog based schemes cannot be efficiently adapted for use with digital signals such as are employed in the aforementioned digital transponder, for example. A need therefore exists for a digital automatic level control system that can be readily adapted for accurately leveling all types of digital signals, including rapidly varying signals, such as bursty signals.

SUMMARY OF THE INVENTION

The present invention fulfills the foregoing need through provision of a digital automatic level control (DALC) system in which all operations are performed on digital signals. The system preferably includes first and second digital delay elements, such as buffers, which enable information about a signal parameter, such as power, from the past, present and future to be processed to provide an optimal gain that can be used to level even rapidly varying signals. By combining both past and future information about the signal parameter, a more accurate estimate of the parameter's present value can be calculated. This estimate can in turn be used by level adjustment elements to adjust the level of the parameter accordingly.

In the preferred embodiments, digital time samples of a signal to be leveled or otherwise controlled are passed through first and second first-in first-out (FIFO) Buffer RAMs, which act as the delay elements. Typically, the time samples represent the voltage or current amplitude (and sign in the case of alternating signals) of the signal at each sampling, but can represent any desired signal parameter. The purpose of the buffers is to create first and second time windows of signal information, the first of which contains future information about the signal parameter's value and the second of which contains past information about the signal parameter's values. This is accomplished in the following manner. As an inputted sequence of time samples enters the first buffer, the samples, after being optionally processed (e.g., converted to all positive values in the case of alternating signals), are also added to a first running sum in a first accumulator. Samples in a first outputted sequence of samples exiting the first buffer and entering the second buffer are similarly processed and both subtracted from the first running sum in the first accumulator and added to a second running sum in a second accumulator. Finally, the samples in a second outputted sequence exiting the second buffer are also subtracted from the second running sum in the second accumulator. Thus, a sum of the information that is in the first buffer at any given instant is always held as the value of the first running sum in the first accumulator. Similarly, the second running sum in the second accumulator holds the sum of the information in the second buffer.

If the point between the two buffers is considered to be the sample at time t, the sum in the first accumulator is proportional to the average magnitude of the samples from t to t+256, and the sum in the second accumulator is proportional to the average magnitude of the samples from t to t−256. These two values can therefore be thought of as an estimate of the average magnitude of the signal parameter for the near future and an estimate of the average magnitude of the signal parameter for the near past, respectively. By choosing the maximum of these two values, the system can, for example, anticipate the beginning of a signal burst, and still have enough delay to compensate the end of a signal burst. Thus, in the preferred embodiments, the values of the two accumulators are compared and the greater of the two is selected and multiplied by a pre-selected value that defines the inverse of the desired level of the signal parameter to generate a level adjusting or gain coefficient. As each of the time samples exits the first buffer, they are also directed to a multiplier that multiples the signals by the level adjusting coefficient, thereby adjusting the signal parameter either higher or lower as required.

In one preferred embodiment of the invention that is specifically designed for leveling the power of multiple signals, multiple channel signals can be leveled, either individually or in groups. This is particularly suited for use in broadband satellite communications systems where a 125 MHz band, for example, may be broken down into 256-0.5 MHz subchannels and each signal may occupy one or more 0.5 MHz subchannel. In this application, the DALC system must normalize the entire signal, not just a 0.5 MHz sub channel of it. If each 0.5 MHz subchannel is leveled, the inherent power spectral density of the signal composed of multiple 0.5 MHz subchannels will be changed, therefore altering the information that the signal carries. Thus the 0.5 MHz subchannels must be summed in order to provide the power of the entire user signal. In this embodiment of the invention, a controller is employed that is programmed with the channel grouping information and instructs the accumulators accordingly to combine the samples from each group of channels or subbands.

The DALC system is thus advantageous over prior analog based systems because it can effectively estimate signal parameters both in the future and past in order to process a gain constant with which to level the signal parameter. In contrast, prior art systems incorporated analog input and output signals using only power estimates from the past. This forced an ALC to have a large time constant (reaction time) and extra hardware. When considering a bursty signal, whose power changes from zero to some level in virtually no time, and conversely from some power level to zero power in no time, if only the information from the past or future is used to process a gain constant, part of the signal burst may be lost. However, by choosing the maximum of these two power estimates, the subject DALC system can anticipate the beginning of a signal burst, and still have enough delay to compensate the end of a signal burst. Therefore, there is effectively zero delay in reaction time to determine the optimal gain constant. In addition, there is no oscillation of the calculated gain constant in situations where the signal power changes quickly, such as with bursty data. The DALC can thus level signals that have relatively slow power variations (due to rain and other atmospheric conditions) and also signals that have quick power variations (due to bursts of data). In addition, the multiple channel embodiment can perform leveling on a channel-by-channel basis, in addition to performing leveling on groups of sub-channels without requiring extra ALC modules. Another benefit of the DALC system is that it can be realized in the same application specific circuit (ASIC) as other digital devices, such as the channelizer in a satellite receiver application, therefore reducing extra hardware.

BRIEF DESCRIPTION OF THE DRAWINGS

The features and advantages of the present invention will become apparent from the following detailed description of a number of preferred embodiments thereof, taken in conjunction with the following drawings, in which:

FIG. 2A illustrates measured power and actual power where only pure feedback (causal) control is employed. FIG. 2B illustrates measured power and actual power where only pure feedforward (non-causal) control is employed. FIG. 2C illustrates measured power and actual power where both feedforward and feedback control are employed as in the embodiments of the present invention.

DETAILED DESCRIPTION OF THE PREFERRED EMBODIMENTS

Figure 1:
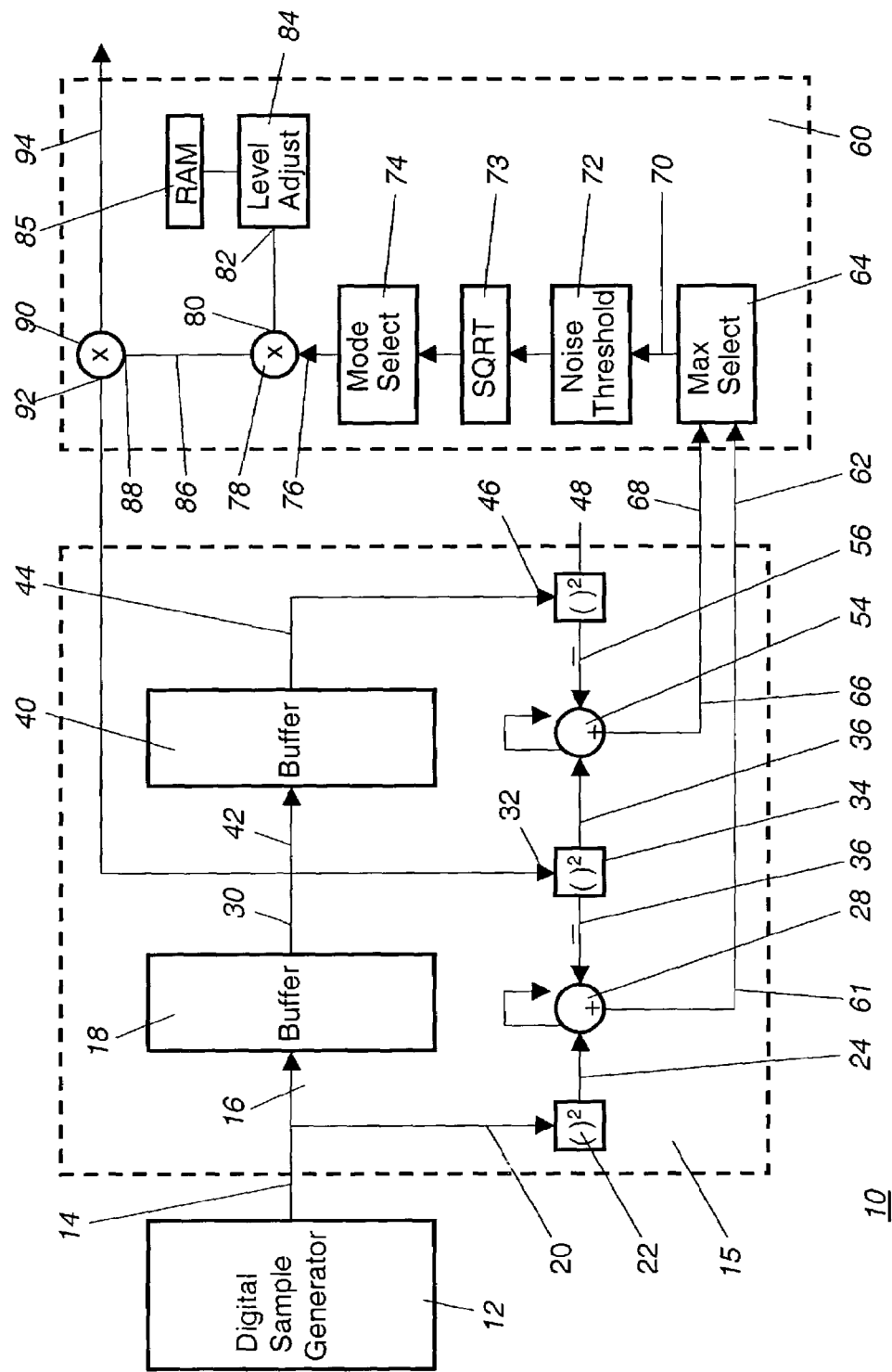
FIG. 1 is a schematic block diagram of a single channel implementation of a digital automatic level control system constructed in accordance with a first preferred embodiment of the invention.

The basic concepts of the present invention can first be understood on a single channel or single user basis. With reference to FIG. 1, a first embodiment of the present invention is illustrated comprising a digital automatic level control (DALC) system 10. The DALC system 10 is designed for controlling the level or amplitude of any single channel signal that is either in the form of, or has been converted into, a sequence of digital time samples. In one preferred application, the DALC system 10 is employed to control the power level of a digital communications signal that is received by a satellite. It will of course be understood that the embodiments of the invention can be employed in any automatic signal level or gain control application.

In the embodiment illustrated in FIG. 1, an incoming signal is input to a digital sampling generator 12 that generates on an output 14, a sequence of digital time samples of the incoming signal. The digital sampling generator 12 is not an actual element of the DALC system 10 and can be any suitable element such as a channelizer, an A/D converter, etc. In the event that the incoming signal is already in digital time sample form, the generator 12 would not be necessary. The sequence of digital time samples is input into a level detector module 15 of the DALC system 10. In the level detector module 15, the samples are fed into both an input 16 of a first FIFO Buffer RAM 18 and an input 20 of a processing element, in this case a first squarer 22. An output 24 of the first squarer 22 is added to a first running sum in an accumulator 28. The first FIFO Buffer RAM 18 outputs a first outputted sequence of time samples on an output 30 that is connected to an input 32 of a second squarer 34. An output 36 of the second squarer 34 is subtracted from the first running sum in the first accumulator 28. The accumulator 28 is preferably implemented using appropriate digital logic, such as adder and complementing logic elements.

The two squarers 22 and 34 are employed for preprocessing the incoming samples because they generate a value that is representative of the incoming sample's power level. More importantly, the incoming signal is often an alternating signal that includes both positive and negative values. In these cases, the DALC system 10 operates by accumulating amplitude measurements of the incoming signal without regard to sign and the squarers 22 and 34 are employed to cancel out negative amplitude values. As an alternative, the squarers could be replaced with absolute value calculating elements. In addition, where the incoming signal is a DC signal with only positive values, the squarer or absolute value calculating elements need not be employed.

The DALC system 10 also includes a second FIFO Buffer RAM 40 which has an input 42 connected to the output 30 of the first FIFO Buffer RAM 18 and an output 44 on which a second outputted sequence of digital time samples is output. The output 44 is connected to an input 46 of a third squarer 48. The output 36 of the second squarer 34 is also added to a second running sum in a second accumulator 54, while an output 56 of the third squarer 48 is subtracted from the second running sum in the second accumulator 54

The first and second FIFO Buffer RAMs 18 and 40 act as shift registers or other digital delay elements and each has a number of stages (e.g., 256) that is selected to impart a predetermined delay between entry and exit of each digital sample in and out of the buffers 18 and 40. Depending on the frequency ranges and the nature of the channel signals, a longer or shorter time constant can be realized by increasing or decreasing the number of shift stages in the FIFO Buffer RAMs 18 and 40. Initially, as digital samples are sequentially input into the first FIFO Buffer RAM 18, each of them is also simultaneously squared by the first squarer 22 and then added to previous samples in the first running sum in the first accumulator 28. Meanwhile, each of the digital samples is also clocked through the first FIFO Buffer RAM 18 until after 256 cycles, the first of the samples exits the buffer 18, is squared by the second squarer 34 and then subtracted from the first running sum in the first accumulator 28. Thus, a squared sum of the information that is in the first buffer 18 is always held as the value of the first running sum in the first accumulator 28. This value represents the average power for these samples.

Similarly, the second accumulator 54 holds the average power of the information in the second FIFO Buffer RAM 40. If the sample in the first outputted sequence of time samples on the output 30 of the first FIFO Buffer RAM 18 is considered to be the sample at time t, the first accumulator 28 holds the average power of the samples from t to t+256, and the second accumulator 54 holds the average power of the samples from t to t−256. These two values can be thought of as a power estimate for the near future and a power estimate for the near past, respectively.

Figure 2A:
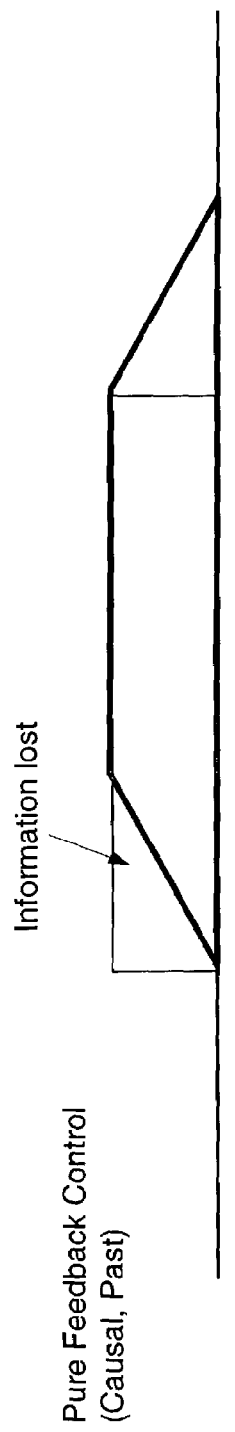
FIGS. 2A–2C are graphs illustrating measured power (thick lines) and actual power (thin lines) of a bursty signal, both as a function of time.
Figure 2B:
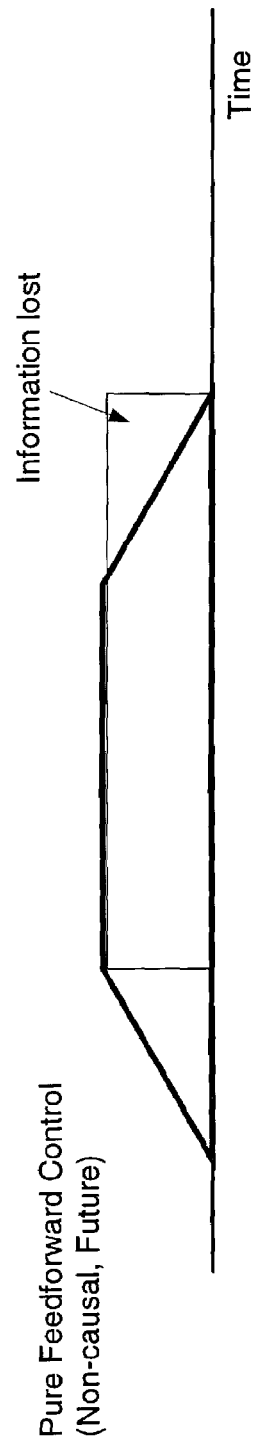

By employing the two accumulators 28 and 54, the first of which contains a power estimate for the near future and the second of which contains a power estimate for the near past, the DALC system 10 can make accurate power estimates of bursty signals whose power levels go from zero to some level or from some level to zero in virtually no time. To illustrate the situation, reference is made to the graphs in FIGS. 2A–2C. Each of the graphs illustrates measured power (thick lines) and actual power (thin lines) of a bursty signal, both as a function of time. FIG. 2A illustrates measured power and actual power where only pure feedback (causal) control is employed. This would be the situation if only the second FIFO Buffer RAM 40 and associated elements were employed in the DALC system 10. When the bursty signal first starts, which is approximated by a step function, the measured power of the signal is substantially below the actual power since past zero level signal data is still in the accumulator. Similarly, where only pure feedforward (non-causal) control is employed, the measured power of the signal drops substantially below the actual power toward the end of the signal burst as illustrated in FIG. 2B since future zero level signal data is gradually added to the sum in the accumulator. This would be the situation if only the first FIFO Buffer RAM 18 and associated elements were employed in the DALC system 10.

Figure 2C:
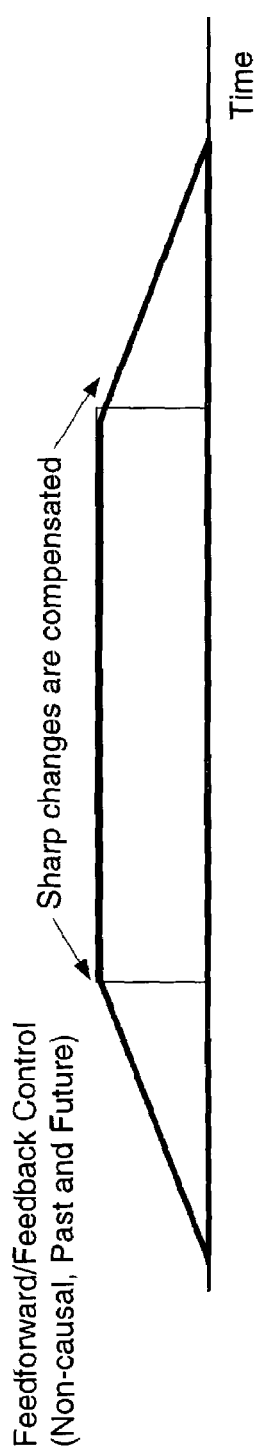

The present invention avoids the drawbacks of both pure feedback and pure feedforward control by combining both techniques in a feedforward/feedback control system. FIG. 2C illustrates the result when both past and future power estimates are made and the maximum of these two measurements is selected. The measured power in this instance is the same as the actual power for the entire duration of the signal burst. Thus, by choosing the maximum of the two power estimates, the DALC system 10 can anticipate the beginning of a signal burst and still have enough delay to compensate the end of a signal burst.

To implement the foregoing functionality and with reference again to FIG. 1, a level adjustment module 60 performs the actual level adjustment of the digital time sample in response to the measurements provided by the first and second accumulators 28 and 54. An output 61 of the first accumulator 28 is connected to a first input 62 of a max selector 64, while an output 66 of the second accumulator 54 is connected to a second input 68 of the max selector 64. Using any suitable known elements, such as a comparator and a multiplexer, the max selector 64 compares the first and second running sums output from the two accumulators 28 and 54 and outputs the higher of the two values at any instant on an output 70. The output 70 thus represents the measured power that would be obtained in FIG. 2C with the illustrated bursty signal as input to the DALC system 10.

The measured power signal output 70 of the max selector 64 is fed first through a noise threshold circuit 72, which rejects any power measurements below a pre-selected level. After passing through the noise threshold circuit 72, the measured power signal passes through a square root calculator 73, which outputs the square root of the power signal that represents an average magnitude of the samples in the selected one of the accumulators 28 or 54. It should be noted that the square root calculator 73 is optional and would not be employed if the squarers 22, 34 and 48 were not employed or were substituted with absolute value calculating elements. This signal generated by the square root calculator 73 is then fed into a mode selector 74 that enables the DALC system 10 to be operated in two other modes in addition to the automatic level control mode. These include a no gain mode in which the digital time samples pass through the DALC system 10 unaltered and a fixed gain mode in which the samples are amplified by a fixed amount, regardless of their present magnitudes.

The output form the mode selector 74 is fed into a first input 76 of a first multiplier 78. A second input 80 of the first multiplier 78 is connected to an output 82 of a level adjustment value generator 84. The value generator 84 accesses a RAM table 85 that is programmed with desired parameter values for the signal parameter to be adjusted. In a power control application, the RAM table 85 holds the inverse of the desired signal power, so that the multiplier 78 multiplies the inverse of the desired signal power by the measured signal power. In this manner, the first multiplier 78 thereby generates a gain coefficient on an output 86. It should be noted that the mode selector 74 also accesses the RAM table 85 when the mode selector 74 is in a fixed or no gain mode. In a fixed gain mode, the mode selector 74 outputs a value that, when multiplied by the value in the RAM table 85, generates a fixed output value. In a no gain mode, the mode selector 74 generates as output, the inverse of the value in the RAM table 85, thus resulting in a unity gain coefficient being generated by the first multiplier 78. The output 86 of the first multiplier 76 is applied to a first input 88 of a second multiplier 90. The digital time sample output 30 from the first FIFO Buffer RAM 18 is connected to a second input 92 of the second multiplier 90. In this manner, the digital signal sample at time t, which is present on the output 30 of the first FIFO Buffer RAM 18, is multiplied by the coefficient generated by the first multiplier 78, thereby generating a level adjusted or normalized signal on a system output 94.

Figure 3:
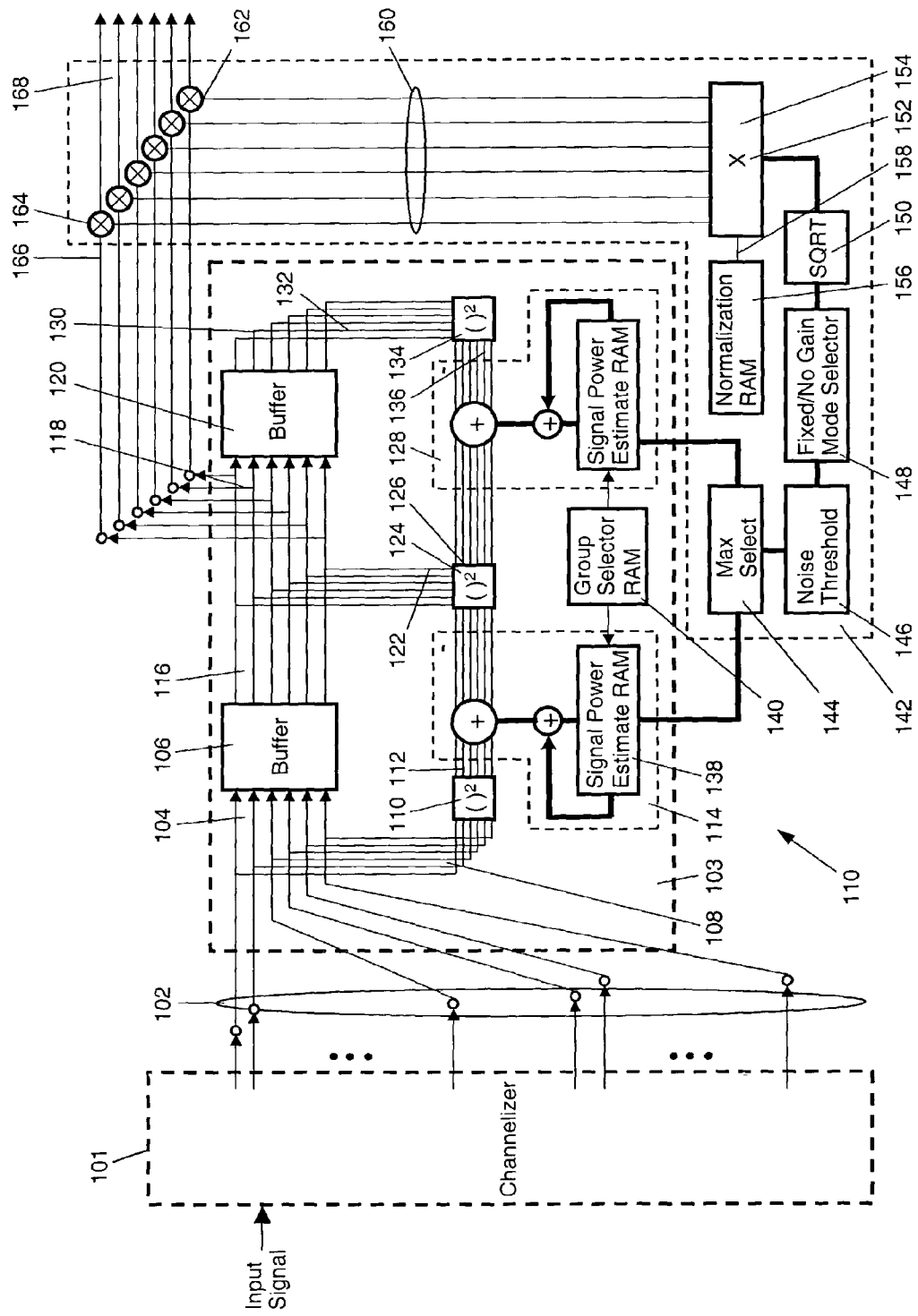
FIG. 3 is a schematic block diagram of a multiple channel implementation of a digital automatic level control system constructed in accordance with a second preferred embodiment of the invention.

FIG. 3 illustrates another preferred embodiment of the present invention that is specifically designed for use with multiple channels. In one known satellite communications system, a digital transponder is employed that separates a 125 MHz band into 256-0.5 MHz subchannels where each of one or more signals may occupy one or more 0.5 MHz subchannels. To normalize each signal, a level control system must normalize the entire signal, not just a 0.5 MHz sub channel of the signal. If each 0.5 MHz subchannel is leveled, the inherent power spectral density of the signal composed of multiple 0.5 MHz subchannels will be changed, therefore altering the information that the signal carries. Thus the 0.5 MHz subchannels must be summed in order to provide the power of the entire user signal.

With reference to FIG. 3, a DALC system 100 is illustrated in which many of the same elements are used that are used in the single channel DALC system 10 of FIG. 1, with the main difference being that the elements are adapted for use with multiple channels or signals in the DACL system 100. The functions of these elements will therefore not be discussed where they are the same as the functions of the same elements in the single channel embodiment. After the 125 MHz transmission signal is received by a receiver (not shown), it is fed into a channelizer 101 that separates the signal into 256 0.5 MHz subbands or channels and generates a sequence of digital time samples for each subband. FIG. 3 shows the channelizer 101 as having a plurality of parallel outputs 102, however, it should be understood that a single output could also be employed where the samples for each subband are multiplexed into a single serial sequence. It should also be noted that the channelizer 101 is not an actual element of the DALC system 100, but is a standard element in a satellite receiver system.

The samples in the input sequence or sequences are directed into a level detector module 103 of the DALC system both to a plurality of inputs 104 of a first FIFO Buffer RAM 106 and to a plurality of inputs 108 of a first squarer 110. The first squarer 110 generates a plurality of outputs 112, each of which is added to a corresponding one of a plurality of running sums in a first accumulator module 114. The first FIFO Buffer RAM 106 includes a plurality of outputs 116, each of which outputs a corresponding one of a plurality of outputted sequences of time samples, one for each subband or channel. These outputted sequences are fed both to a plurality of inputs 118 of a second FIFO Buffer RAM 120 and to a plurality of inputs 122 of a second squarer 124. The second squarer 124 generates a plurality of outputs 126, each of which is subtracted from a corresponding one of the plurality of running sums in the first accumulator module 114. In addition, the outputs 126 are each added to a corresponding one of a plurality of running sums in a second accumulator module 128. The second FIFO Buffer RAM 120 includes a plurality of outputs 130, each of which outputs a corresponding one of a second plurality of outputted sequences of time samples, one for each subband or channel. These outputted sequences are fed to a plurality of inputs 132 of a third squarer 134. The third squarer 134 generates a plurality of outputs 136, each of which is subtracted from a corresponding one of the plurality of running sums in the second accumulator module 128.

Each of the accumulator modules 114 and 128 can be programmed to group samples for more than one subband together if and as desired, since each signal may reside in multiple subbands, thereby requiring that the power estimates of multiple subbands be accumulated in a single accumulator. To facilitate this requirement, each of the accumulator modules 114 and 128 includes a signal power estimation RAM 138 that accumulates sums for each group of subbands. The signal power estimation RAM 138 receives grouping instructions from a group selector RAM 140 that determines grouping of the subbands. In a satellite application of this embodiment, the group selector RAM 140 is updated by the ground control. For any signal that employs multiple subbands, the signal resides in consecutive subbands, so the group selector RAM must simply specify if each subband should be grouped with the previous group power estimate or a new group power estimate. Based on these instructions, the signal power estimation RAMs 138 combines accumulated sums for each of the subbands into a plurality of groups of sums, one for each signal. In a maximum case scenario there may be one signal in each subband, while in a minimum case scenario there may be only one signal in all of the subbands. Therefore, there must be one available signal power estimate slot for each subband.

As in the single channel embodiment, the outputs from the accumulator modules 114 and 128 are fed into a level adjustment module 142 that includes a max selector 144 for selecting the maximum of the two outputs from the signal power estimate RAMs 138 for each signal. The selected output is then passed through a noise thresholder 146, a mode selector 148 and a square root calculator 150 before finally being applied to a first input 152 of a multiple channel multiplier 154. A normalization RAM 156 is connected to a second input 158 and supplies the requisite normalization value, depending on the selected mode of operation. The normalization RAM holds a quantity of the normalization set point divided by the total number of subbands. Like the group selector RAM 140, the mode selector 148 and the normalization RAM 156 are updated from ground control in a satellite application of the embodiment. Finally, the first multiplier 154 generates a plurality of gain coefficient outputs 160, each of which is fed to a first input 162 of a corresponding one of a plurality of output signal multipliers 164, one for each subband. A second input 166 of each output multiplier 164 supplies the digital time samples for each of the subbands as they exit the first FIFO Buffer RAM 106. Each of the multipliers 164 thereby generates an output 168 comprising a sequence of time samples whose amplitudes are larger or smaller than those of the original samples, depending on the values of the gain coefficients from the first multiplier 154.

In conclusion, the present invention provides a digital automatic level control system that is particularly suited for detecting and leveling rapidly varying signals, such as bursty signals. The use of multiple delay elements enables the DALC system to estimate signal parameters both in the future and in the past in order to process a gain constant with which to level the signal parameter. Using the second embodiment of the DALC system, leveling can be performed on a channel-by-channel basis, in addition to performing leveling on groups of sub-channels without requiring extra ALC modules.

Although the invention has been disclosed in terms of a number of preferred embodiments, it will be understood that numerous variations and modifications could be made thereto without departing from the scope of the invention as defined in the following claims.

What is claimed is:

1. A digital automatic level control (DALC) system comprising:
   a level detector module including:
   a first digital delay element having an input for receiving a sequence of inputted digital time samples of a signal to be leveled and an output for sequentially outputting a first sequence of outputted time samples after a pre-selected delay;
   a first accumulator for receiving said sequence of inputted time samples and adding each of said inputted samples to a first running sum, and for receiving said sequence of outputted time samples on said output of said delay element and subtracting each of said outputted time samples from said first running sum, whereby said first running sum is representative of the average value of all time samples presently contained in said first delay element;
   a second digital delay element having an input for receiving said sequence of outputted digital time samples from said output of said first digital delay element and an output for sequentially outputting a second sequence of outputted time samples after a predetermined delay; and
   a second accumulator for receiving said first sequence of outputted time samples and adding each of said first sequence of outputted time samples to a second running sum, and for receiving said second sequence of outputted time samples on said output of said second delay element and subtracting each of said outputted time samples in said second sequence from said second running sum, whereby said second running sum is representative of the average value of all time samples presently contained in said second delay element; and
   a level adjustment module for employing the greater of said first and second running sums to form a level adjusted output sequence of digital time samples.

2. The DALC system of claim 1, wherein said first and second digital delay elements comprise first and second digital buffers.

3. The DALC system of claim 1, further comprising first, second and third processing elements, said first processing element being disposed between said input of said first delay element and said input of said first accumulator for processing said inputted sequence of time samples prior to adding said inputted sequence of time samples to said first running sum in said first accumulator; a second processing element disposed between said output of said first delay element and said inputs of said first and second accumulators for processing said first outputted sequence of time samples prior to said first outputted sequence of time samples being subtracted from said first running sum in said first accumulator and added to said second running sum in said second accumulator; and, a third processing element disposed between said output of said second digital delay element and said input of said second accumulator for processing said time samples in said second outputted sequence prior to being subtracted from said second running sum in said second accumulator.

4. The DALC system of claim 3, wherein said processing elements comprise first, second and third squarers for squaring said inputted time samples, said time samples in said first outputted sequence and said time samples in said second outputted sequence, respectively, whereby said first running sum is proportional to the average power of said time samples contained in said first delay element and said second running sum is proportional to the average power of said time samples contained in said second delay element.

5. The DALC system of claim 4, wherein said level adjustment module includes:
   a square root calculating element for calculating and outputting a square root of the greater of said first and second running sums in said first and second accumulators, respectively;
   a first multiplier for multiplying said output from said square root calculating element by a constant and thereby generating a gain coefficient; and
   a second multiplier for multiplying said outputted samples in said first sequence by said gain coefficient, thereby forming a level adjusted output sequence of digital time samples.

6. The DALC system of claim 3, wherein said processing elements comprise first, second and third absolute value calculating elements for generating an absolute value of said inputted time samples, said time samples in said first outputted sequence and said time samples in said second outputted sequence, respectively.

7. The DALC system of claim 1, wherein said level adjustment module includes:
   a first multiplier for multiplying the greater of said first and second running sums in said first and second accumulators, respectively, by a constant and thereby generating a gain coefficient; and
   a second multiplier for multiplying said outputted samples in said first sequence by said gain coefficient, thereby forming a level adjusted output sequence of digital time samples.

8. The DALC system of claim 7, wherein said level adjustment module further includes a max selector element for comparing said first and second running sums and supplying the greater of said sums to said first multiplier.

9. The DALC system of claim 7, wherein said level adjustment module further includes a thresholder for receiving the greater of said sums from said max selector element and directing the greater of said sums to said first multiplier only if the greater of said sums exceeds a predetermined threshold value.

10. The DALC system of claim 7, wherein said level adjustment module further includes a mode selector for selecting among an automatic level control mode, a fixed gain mode in which a fixed gain coefficient is supplied to said second multiplier and a no gain mode in which a gain coefficient of unity is supplied to said second multiplier.

11. The DALC system of claim 1, wherein said inputted sequence of time samples includes samples from a plurality of signals and a group selector is provided for instructing said first and second accumulators to group samples from each of said signals together into a plurality running sums, one in each said accumulator for each of said signals.

12. The DALC system of claim 1, wherein said level detector and said level adjustment modules are formed on a single application specific integrated circuit.

13. A method for automatically controlling the level of one or more digital signals comprising the steps of:
   providing an input sequence of digital time samples of at least one signal to be leveled;
   adding each of said time samples in said sequence to a first running sum;
   passing said input sequence of digital time samples through a first digital delay element, thereby forming a first outputted sequence of digital time samples;
   subtracting each of said time samples in said first outputted sequence from said first running sum as they are outputted from said first digital delay element, whereby said first running sum is representative of the average value of all time samples presently contained in said first delay element;

adding each of said time samples in said first outputted sequence to a second running sum as they are outputted from said first digital delay element;

passing said first outputted sequence of digital time samples through a second first digital delay element, thereby forming a second outputted sequence of digital time samples;

subtracting each of said time samples in said second outputted sequence from said second running sum as they are outputted from said second digital delay element, whereby said second running sum is representative of the average value of all time samples presently contained in said second delay element; and employing the greater of said first and second running sums to form a level adjusted output sequence of digital time samples.

14. The method of claim 13, wherein said first and second digital delay elements are selected to be first and second digital buffers.

15. The method of claim 13, further comprising the steps of processing said inputted sequence of time samples prior to adding said inputted sequence of time samples to said first running sum, processing said first outputted sequence of time samples prior to said first outputted sequence of time samples being subtracted from said first running sum and added to said second running sum, and processing said time samples in said second outputted sequence prior to being subtracted from said second running sum.

16. The method of claim 15, wherein said steps of processing further comprise squaring said inputted time samples, said time samples in said first outputted sequence and said time samples in said second outputted sequence, whereby, said first running sum is proportional to the average power of said time samples contained in said first delay element and said second running sum is proportional to the average power of said time samples contained in said second delay element.

17. The method of claim 16, wherein said step of employing the greater of said first and second running sums to adjust the level of each of said outputted samples in said first outputted sequence further comprises:

calculating a square root of the greater of said first and second running sums;

multiplying said square root by a constant and thereby generating a gain coefficient; and multiplying said samples in said first outputted sequence by said gain coefficient, thereby forming a level adjusted output sequence of digital time samples.

18. The method of claim 15, wherein said steps of processing further comprise calculating the absolute values of said inputted time samples, said time samples in said first outputted sequence and said time samples in said second outputted sequence.

19. The method of claim 13, wherein said step of employing the greater of said first and second running sums to adjust the level of each of said outputted samples in said first outputted sequence further comprises:

multiplying the greater of said first and second running sums by a constant and thereby generating a gain coefficient; and multiplying said samples in said first outputted sequence by said gain coefficient, thereby forming a level adjusted output sequence of digital time samples.

20. The method of claim 13, wherein said inputted sequence of time samples includes samples from a plurality of signals and said method further comprises the steps of grouping samples from each of said signals together and forming a plurality of running sums during said adding and subtracting steps, one for each signal having samples in said first delay element and one for each signal having samples in said second delay element.

* * * * *